United States Patent [19]

Komuro

[11] Patent Number: 5,780,902
[45] Date of Patent: Jul. 14, 1998

[54] SEMICONDUCTOR DEVICE HAVING LDD STRUCTURE WITH POCKET ON DRAIN SIDE

[75] Inventor: Toshio Komuro, Tokyo, Japan

[73] Assignee: NEC Corporation, Japan

[21] Appl. No.: 764,105

[22] Filed: Dec. 6, 1996

[30] Foreign Application Priority Data

Dec. 25, 1995 [JP] Japan ................................ 7-336277

[51] Int. Cl.[6] ........................................ H01L 31/113
[52] U.S. Cl. ........................ 257/344; 257/335; 257/336; 257/408
[58] Field of Search ........................... 257/336, 344, 257/408, 335, 394

[56] References Cited

U.S. PATENT DOCUMENTS

| Re. 32,800 | 12/1988 | Han et al. | 257/336 |
|---|---|---|---|
| 4,514,897 | 5/1985 | Chiu et al. | 257/344 |
| 4,597,824 | 7/1986 | Shinada et al. | 257/336 |
| 4,636,822 | 1/1987 | Codella et al. | 257/344 |
| 4,649,629 | 3/1987 | Miller et al. | 257/344 |
| 4,986,639 | 1/1991 | Bergonzoni | 257/336 |
| 5,177,568 | 1/1993 | Honma et al. | 257/295 |
| 5,198,687 | 3/1993 | Baliga | 257/335 |
| 5,371,395 | 12/1994 | Ma et al. | 257/335 |
| 5,424,567 | 6/1995 | Chen | 257/344 |
| 5,449,937 | 9/1995 | Arimura et al. | 257/344 |
| 5,532,508 | 7/1996 | Kaneko et al. | 257/336 |
| 5,583,364 | 12/1996 | Nakamura | 257/344 |

FOREIGN PATENT DOCUMENTS

| 4211178 | 8/1992 | Japan. |
| 5267331 | 10/1993 | Japan. |

OTHER PUBLICATIONS

Ogura et al; "A Half Micron MOSFET Using Double Implanted LDD"; 1982; pp. 718-721; IEEE.

*Primary Examiner*—Carl W. Whitehead
*Attorney, Agent, or Firm*—Hayes, Soloway, Hennessey, Grossman & Hage, P.C.

[57] ABSTRACT

A semiconductor device with an LDD structure type MOS transistor is fabricated by forming a gate electrode on a semiconductor layer of a first conductivity type and a source/drain region in the semiconductor layer, the source/drain region having a high impurity concentration region and a low impurity concentration region of a second conductivity type. A pocket of the first conductivity type is formed in contact with the low impurity concentration region only on a drain region side and immediately under the low concentration region of the second conductivity type. The pocket formed only on the drain side can suppress the short channel effect and also the hot carrier generation without lowering the current capacity on the source side where no pocket is present.

4 Claims, 7 Drawing Sheets

SEMICONDUCTOR DEVICE HAVING LDD STRUCTURE WITH POCKET ON DRAIN SIDE

BACKGROUND OF THE INVENTION (1) Field of the Invention

The present invention relates to the fabrication of semiconductor devices, and more particularly to MOS semiconductor devices having an improved LDD (lightly doped drain) structure with a pocket layer and a method for fabricating the same.

(2) Description of the Related Art

As an LDD structure MOS transistor having a low impurity concentration layer between a source/drain layer and a gate, an improved LDD structure with a pocket has been proposed to suppress short channel effects. FIG. 1 shows a MOS transistor having this structure. In the proposed transistor, a field oxide film 22, a gate oxide film 23 and a polysilicon gate electrode 24 are formed on a P-type silicon substrate 21. A low impurity concentration diffusion layer region 25 of an LDD structure is formed in the substrate by diffusing an N-type impurity with the gate electrode 24 used as a mask. Pockets 26 are also formed by ion implanting a P-type impurity with the gate electrode 24 used as a mask. A source/drain high impurity concentration diffusion layer region 28 is further formed by a CVD process depositing a silicon oxide film, etching back this film by reactive ion etching to form side wall spacers 27 on side walls of the gate electrode 24 and ion implanting an N-type impurity with the side wall spacers 27 used as a mask. With this structure, the pocket implant layer has an effect of alleviating the drain field to suppress the short channel effects.

FIG. 2 shows a similar MOS transistor which is disclosed in, for instance, Japanese Patent Application Kokai Publication No. Hei 5-267331. Again in this technique, a field oxide film 22, a gate oxide film 23 and a polysilicon gate electrode 24 are formed on a P-type silicon substrate 21. Here, a source/drain low impurity concentration diffusion layer region 31 is formed by ion implanting an N-type impurity with the gate electrode 24 used as a mask, and a source/drain high impurity concentration diffusion layer region 32 is formed by depositing a thermal oxide film on the surfaces of the gate electrode and source and drain regions and ion implanting an N-type impurity with the thermal oxide film used as a mask. Pockets 33 are then formed by removing the thermal oxide film with a hydrofluoric acid solution and ion implanting a P-type impurity with the gate electrode used as a mask. This technique has a feature in that no etching-back is used in the fabrication.

FIG. 3 shows another MOS transistor which is disclosed in Japanese Patent Application Kokai Publication No. Hei 4-211178. This MOS transistor is an example of laminated gate type non-volatile memory cell. In this technique, a field oxide film 22, a first gate oxide film 35, a floating gate electrode 36, a second gate oxide film 37 and a control gate electrode 38 are patterned and formed on a P-type silicon substrate 21. Then, by using these gates as masks, pockets 39 are formed by ion implanting a P-type impurity at an angle of 8 degrees or larger from a direction normal to the silicon substrate. Then, again using the gates as masks, a source/drain high impurity concentration diffusion layer region 40 is formed by ion implanting an N-type impurity from the direction normal to the silicon substrate surface. The objective of the technique is to improve the efficiency of writing data in the memory cell by increasing the amount of the hot electrons generated through the increase of the electric field intensity in the neighborhood of the drain. It is a feature of this technique that the ion implanting is made at an inclined angle in order to ensure stable positioning of the pockets 39 to be underneath the gate by a heat treatment.

The structures shown in FIGS. 1 and 2, however, have a problem that, since a pocket is provided on the source side as well as the drain side, the channel resistance increases thus reducing the current capacity of the transistor. For the structure shown in FIG. 3, no explanation is given about the LDD structure formation, and the aim of the disclosed fabrication method is to increase the hot electron generation. This is opposite in concept to the primary object of LDD structure transistors where hot carrier generation is suppressed.

FIG. 4 shows a modified LDD structure MOS transistor which meets the object of preventing the current capacity reduction. In the fabrication of this MOS transistor, a field oxide film 22, a gate oxide film 23 and a gate electrode 24 are formed on a silicon substrate 21 and, by using the gate electrode as a mask, a source/drain low impurity concentration diffusion layer 41 is formed by ion implanting an N-type impurity. Then, an N-type diffusion layer region 42 is formed by ion implanting an N-type impurity at a relatively high concentration only on the source side by forming a resist pattern covering the drain side. Side wall spacers are further formed on polysilicon gate side walls by depositing a silicon oxide film by a CVD process and etching back the film by reactive ion etching. A source/drain high impurity concentration diffusion layer region 43 is then formed by ion implanting an N-type impurity with the side wall spacers used as a mask. This technique has a feature that the channel resistance is reduced because the source side has a higher impurity concentration than the drain side.

Since the source side concentration in this structure is higher than the drain side, the channel resistance is reduced to increase the current capacity of the transistor. However, the influence of the drain electric field on the source region is increased, and punch-through occurs more readily with reducing channel length.

SUMMARY OF THE INVENTION

An object of the present invention is to provide a semiconductor device with an LDD structure MOS transistor, which can suppress hot carrier generation while suppressing the short channel effect without reducing the channel capacity, and a method for fabricating the same.

According to one aspect of the invention, there is provided a semiconductor device which comprises:

- an LDD structure type MOS transistor including a gate electrode formed on a semiconductor layer of a first conductivity type;
- a source/drain region formed in the semiconductor layer and having a high impurity concentration region and a low impurity concentration region of a second conductivity type; and
- a pocket of the first conductivity type formed in contact with the low impurity concentration region only on a drain region side.

The pocket may be positioned immediately under the low impurity concentration region of the second conductivity type, and may extend at least partly into a region between the low impurity concentration region of the second conductivity type and a channel region.

The semiconductor device according to the invention is an LDD type structure MOS transistor with the pocket provided in contact with the LDD layer only on the drain region side.

Thus, the pocket can suppress the short channel effect while also suppressing the hot carrier generation. The current capacity is also improved because no pocket is present on the source side.

The pocket can be formed on the drain side only by adding or even without adding a process of masking to cover the source side in the steps of the prior art method for fabricating the LDD structure MOS transistors. Thus, the semiconductor device according to the invention can be readily formed without need of any complicated process.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 5A:
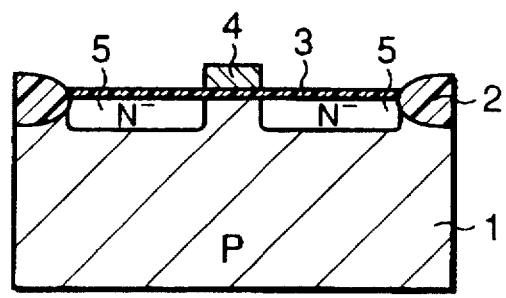
FIGS. 5A to 5C are sectional views showing steps of fabricating a transistor according to a first embodiment of the invention.
Figure 5B:
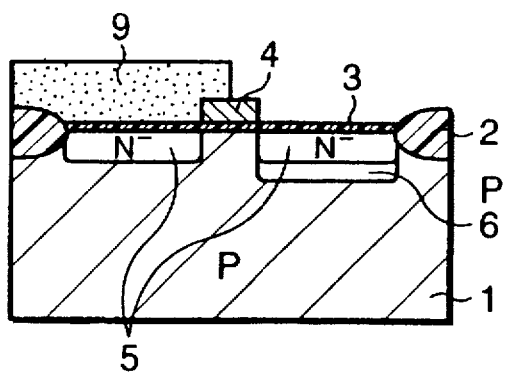
Figure 5C:
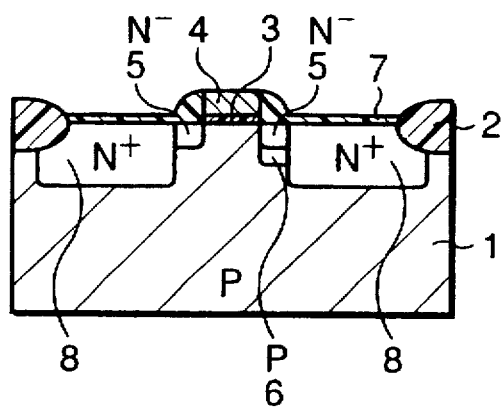

FIGS. 5A to 5C are sectional views showing steps of fabricating a semiconductor device according to a first embodiment of the invention. As shown in FIG. 5A, a field oxide film 2 and a gate oxide film 3 are formed on a P-type silicon substrate 1 by using a well-known technique. On this gate oxide film 3, there is formed a gate electrode 4 of polysilicon in which the resistivity is lowered by the introduction of, for instance, phosphorus, and which has a width of 0.3–0.5 μm and a thickness of 2000–4000 Å. A source/drain low impurity concentration N-type region 5 is then formed by ion implanting an N-type impurity, for instance, phosphorus, at a dose rate of $1 \times 10^{13}$–$5 \times 10^{13}$ cm$^{-2}$ and with an acceleration energy of 10–30 keV by using the gate electrode 4 as a mask.

As shown in FIG. 5B, a pocket 6 is then formed on the drain side by forming a resist pattern 9 covering the source side and ion implanting a P-type impurity, for instance, boron, at a dose rate of $1 \times 10^{13}$–$3 \times 10^{13}$ cm$^{-2}$ and with an acceleration energy of 10–30 keV by using the resist pattern as a mask.

As shown in FIG. 5C, side wall spacers 7 are then formed on the gate electrode by forming an insulating film on the gate electrode 4 and the source/drain region and anisotropically etching the insulating film. Then, a source/drain high impurity concentration N-type region 8 is formed by ion implanting an N-type impurity, for instance, arsenic, at a dose rate of $1 \times 10^{15}$–$5 \times 10^{15}$ cm$^{-2}$ and with an acceleration energy of 30–50 keV by using the gate electrode 4 and side wall spacers 7 as masks.

In the MOS transistor formed in the way described above, the pocket 6 is formed in the source/drain region only on the drain side thereof. The pocket 6 thus is able to suppress the short channel effect, while the current capacity is not reduced because no pocket is present on the source side.

Figure 1:
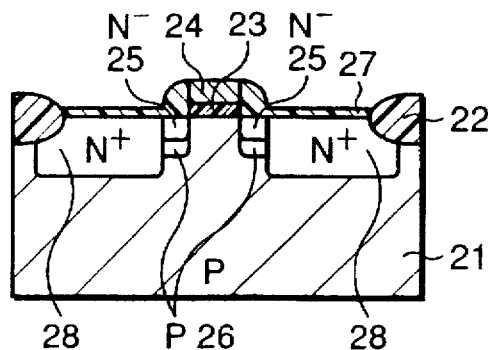
FIG. 1 is a sectional view showing a first example of the prior art transistor.
Figure 2:
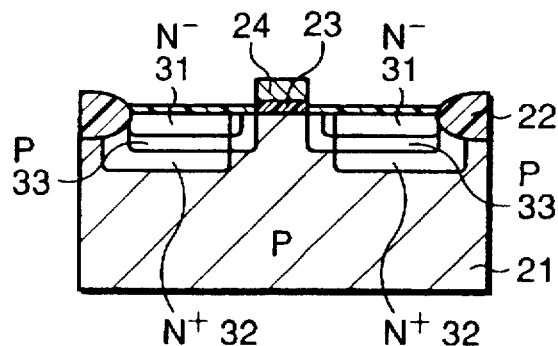
FIG. 2 is a sectional view showing a second example of the prior art transistor.
Figure 6:
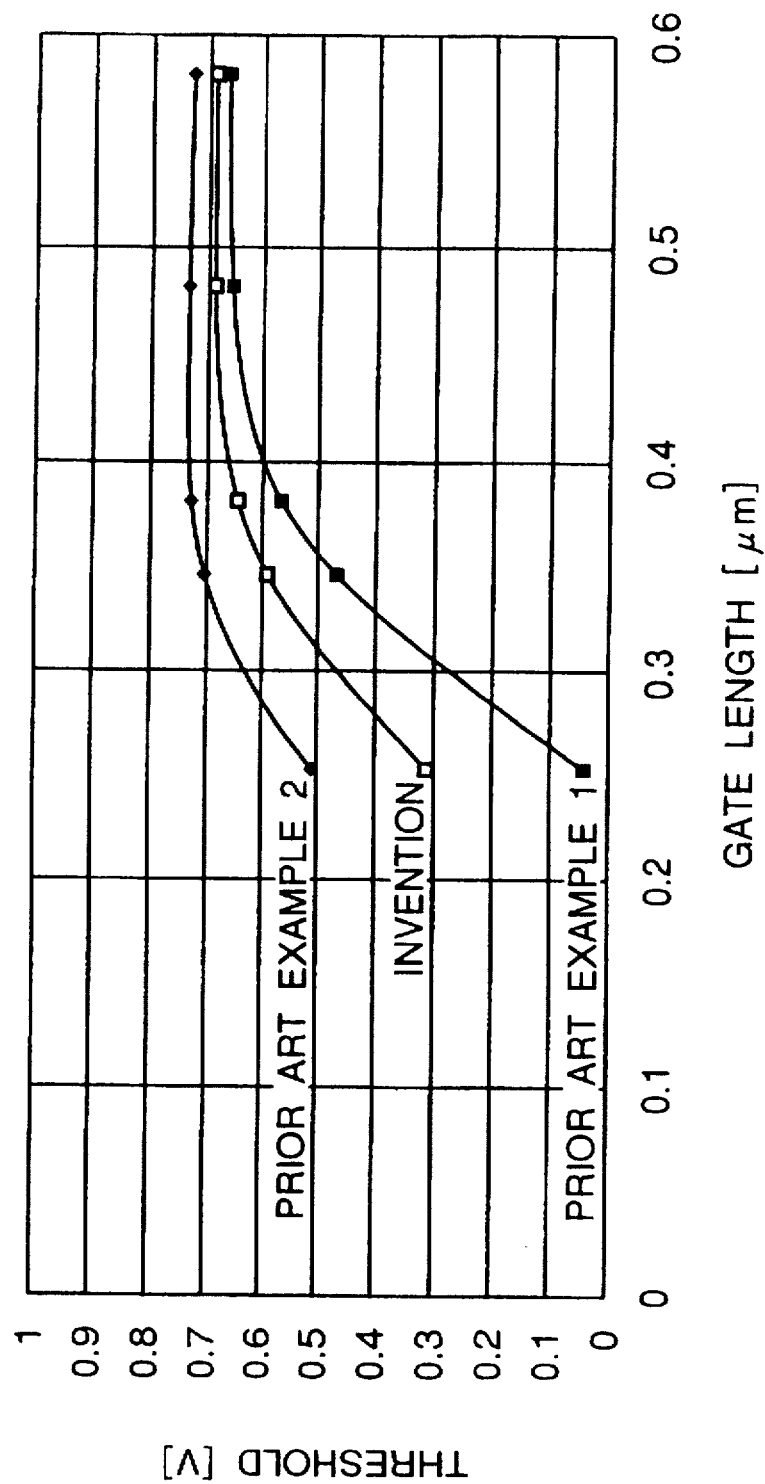
FIG. 6 is a graph showing threshold voltage versus gate length characteristics of transistors according to the invention and in the prior art.
Figure 7:
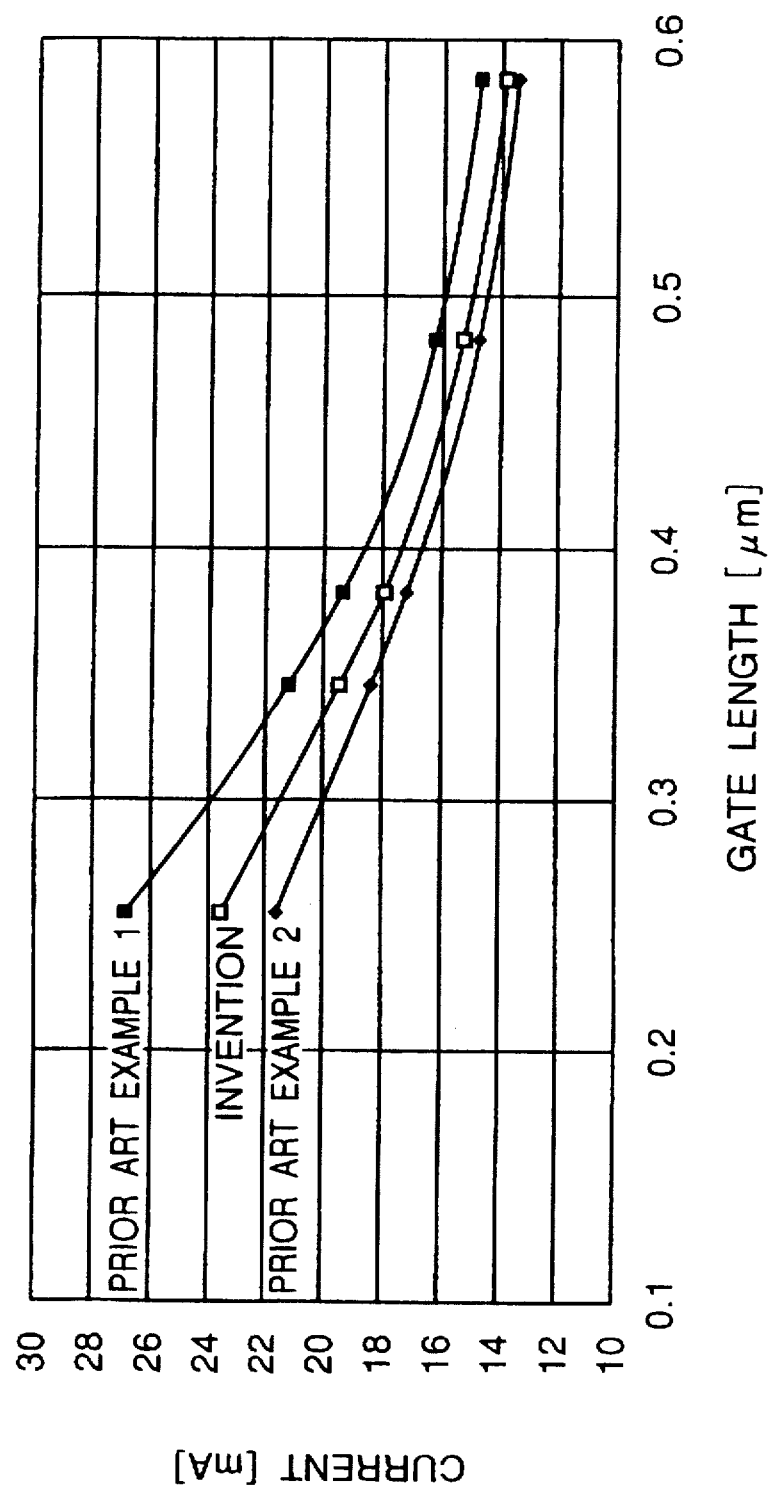
FIG. 7 is a graph showing current versus gate length characteristics of transistors according to the invention and in the prior art.
Figure 8:
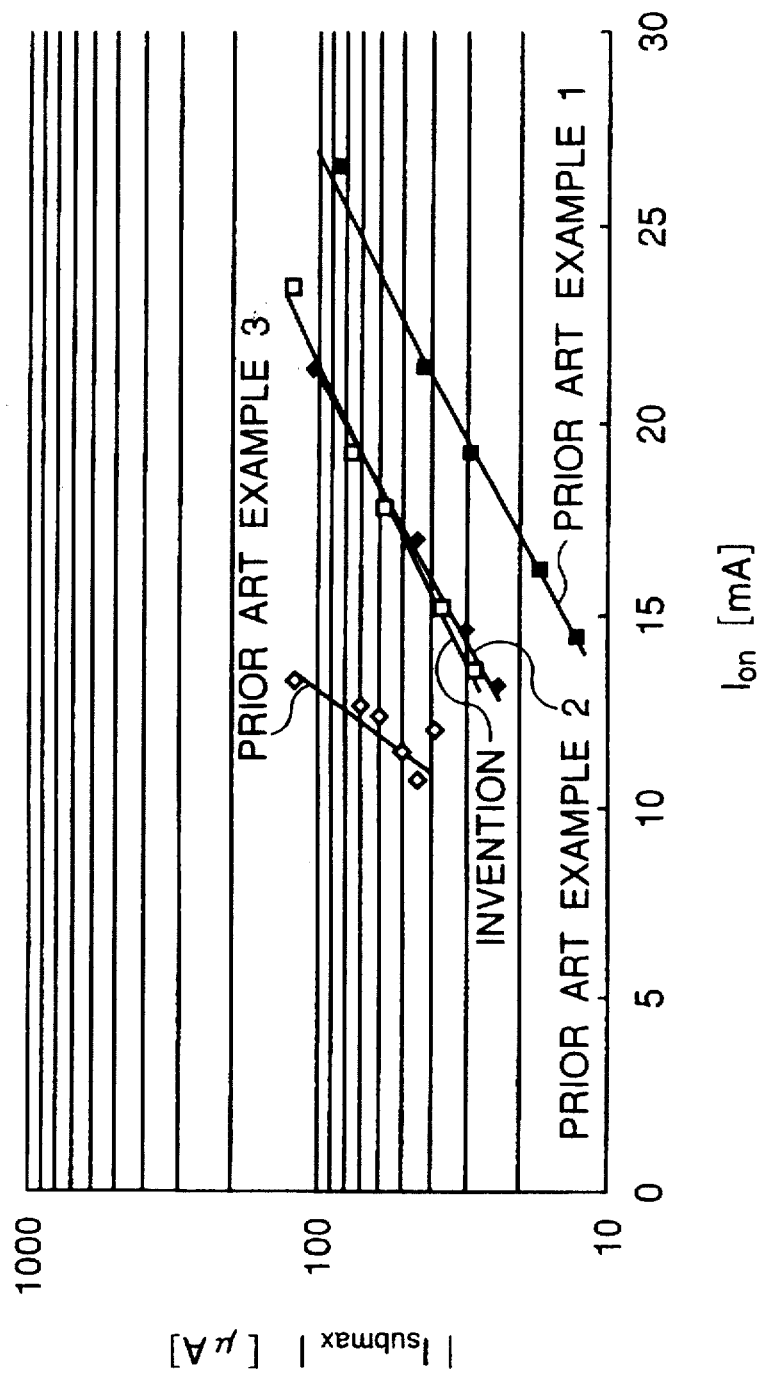
FIG. 8 is a graph showing $I_{submax}$ versus $I_{on}$ characteristics of transistors according to the invention and in the prior art.

Characteristics tests were conducted on transistors fabricated as a trial with a gate oxide film thickness of 100 Å, a side wall spacer thickness of 1,200 Å and a channel width of 50 μm. FIGS. 6 to 8 show results of the tests. The trial transistors fabricated were the prior art LDD type transistor (prior art example 1) shown in FIG. 1, the modified LDD transistor (prior art example 2) with pockets on both the source and drain sides as shown in FIG. 2, and an improved LDD type transistor (invention) with a pocket only on the drain side.

FIG. 6 shows the gate length dependency of the threshold. Among the three different transistors, the one in which the short channel effect is suppressed most is the transistor of the prior art example 2 with pockets on both the source and drain sides. This is attributable to the alleviation of the influence of the drain field on the channel and source regions by the pocket. The current in this transistor, on the other hand, is greatly reduced compared to the LDD type transistor of the prior art example 1, as shown in FIG. 7.

Figure 3:
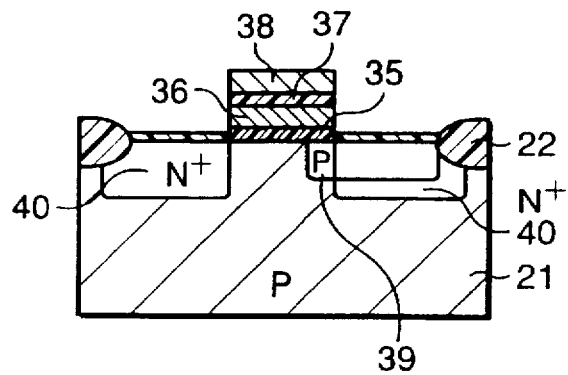
FIG. 3 is a sectional view showing a third example of the prior art transistor.
Figure 4:
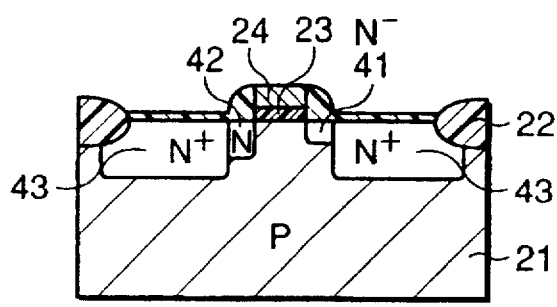
FIG. 4 is a sectional view showing a fourth example of the prior art transistor.

FIG. 8 shows the relation obtained between the maximum substrate current $I_{submax}$ and the "on" current $I_{on}$ as a measure of element characteristic deterioration of the transistor by the hot carrier injection. In view of this characteristic, the transistor according to the invention is comparable to the transistor of the prior art example 2 with pockets on both the source and drain sides because it has the same drain side structure, although these two transistors are inferior to the transistor of the prior art example 1. However, the element characteristic deterioration due to the hot carrier injection in the transistor according to the invention is a lesser extent when compared to the transistor shown in FIG. 3 (prior art example 3), which does not have the LDD structure but has pockets in contact with the high impurity concentration source/drain region.

Figure 9A:
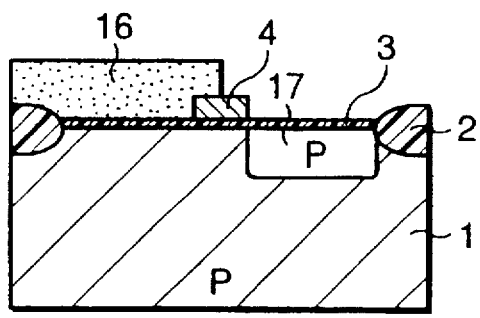
FIGS. 9A to 9C are sectional views showing steps of fabricating a transistor according to a second embodiment of the invention.
Figure 9B:
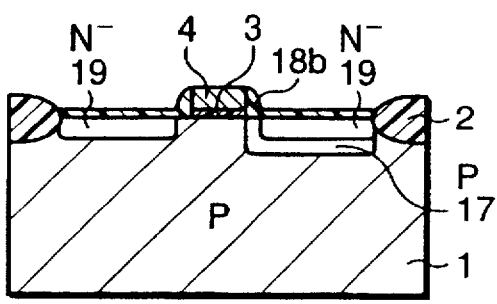
Figure 9C:
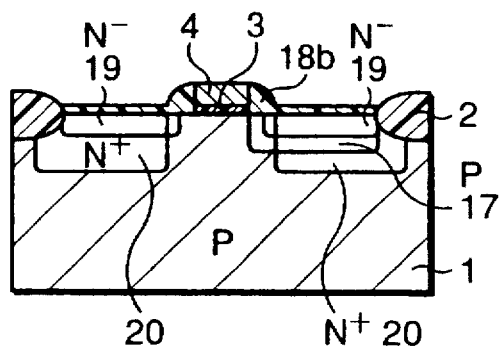

FIGS. 9A to 9C show steps of fabricating a transistor according to a second embodiment of the invention. This embodiment concerns an N-type MOS transistor. As shown in FIG. 9A, as in the preceding first embodiment a field oxide film 2, a gate oxide film 3 and a gate electrode 4 are formed on a P-type silicon substrate 1, and a source/drain low impurity concentration N-type region 11 is formed by ion implanting an N-type impurity, for instance, phosphorus, at a dose rate of $1 \times 10^{13}$–$5 \times 10^{13}$ cm$^{-2}$ and at an acceleration energy of 10–30 keV by using these gate parts as masks.

As shown in FIG. 9B, side wall spacers 12 are then formed on the gate electrode 4 by forming an insulating film on the gate electrode 4 and the source/drain region and anisotropically etching the film. Then, a pocket 14 is formed on the drain side by forming a resist pattern 13 covering the source side and ion implanting a P-type impurity, for instance, boron, at a dose rate of $1\times10^{13}$–$3\times10^{13}$ cm$^{-2}$ and with an acceleration energy of 10–30 keV by using the resist pattern 13 as a mask. The ion implantation of boron is done from the drain side at an angle of 45 degrees to the silicon substrate 1.

As shown in FIG. 9C, the resist pattern 13 is then removed, and a source/drain high impurity concentration region 15 is finally formed as an N-type region by ion implanting an N-type impurity, for instance, arsenic, at a dose rate of $1\times10^{15}$–$5\times10^{15}$ cm$^{-2}$ and with an acceleration energy of 30–50 keV with the gate electrode 4 and the side wall spacers 12 used as masks.

Again with this second embodiment, since the LDD transistor is fabricated with the pocket 14 formed only on the drain side, the pocket 14 is effective to suppress the short channel effect, while the current capacity is not reduced because no pocket is present on the source side.

Figure 10:
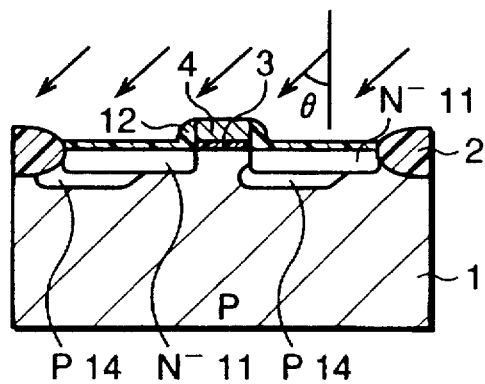
FIG. 10 is a sectional view showing a modification of the method for fabrication according to the second embodiment of the invention.

In the above second embodiment, the resist pattern 13 was used to form the pocket as shown in FIG. 9B. As shown in FIG. 10, however, it is possible to form the pocket without use of any resist pattern but by ion implanting boron at an angle θ from the direction normal to the silicon substrate 1. That is, when the angle θ meets a condition tan θ=y/x where x is the width of the side wall spacers 12 and y is the height of the gate electrode 4, boron is ion implanted in the N-type low impurity concentration layer 11 on the source side. This region is subsequently made to be the high impurity concentration layer 15. Thus, no pocket is formed, and the channel resistance is not increased.

Figure 11A:
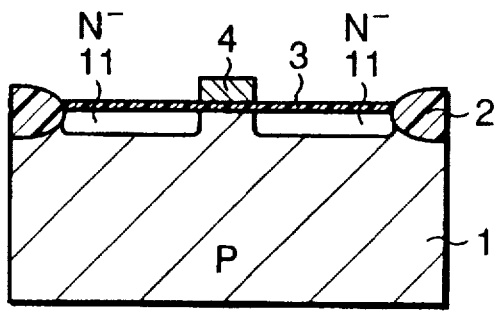
FIGS. 11A to 11C are sectional views showing steps of fabricating a transistor according to a third embodiment of the invention.
Figure 11B:
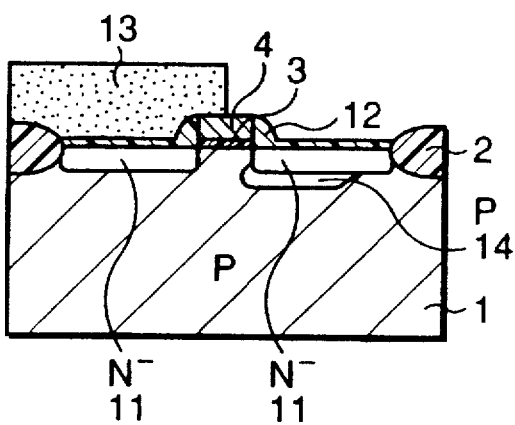
Figure 11C:
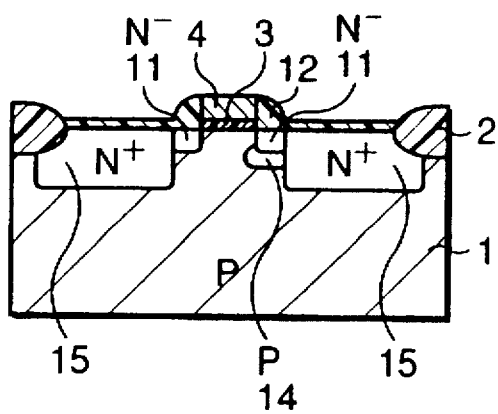

FIGS. 11A to 11C show a third embodiment of the invention. This embodiment can improve the pocket formation control. As shown in FIG. 11A, after a field oxide film 2, a gate oxide film 3 and a gate electrode 4 have been formed on a P-type silicon substrate 1, a resist pattern 16 is formed to cover the source side, and a pocket 17 is formed on the drain side by ion implanting a P-type impurity, for instance, boron, at a dose rate of $1\times10^{13}$–$3\times10^{13}$ cm$^{-2}$ and with an acceleration energy of 10–30 keV with the resist pattern 16 used as a mask.

As shown in FIG. 11B, the resist pattern 16 is then removed, and first side wall spacers 18a are formed on gate electrode side walls by forming an insulating film on the gate electrode 4 and the source/drain region and anisotropically etching the film. Then, a source/drain low impurity concentration N-type region 19 is formed by ion implanting an N-type impurity, for instance, phosphorus, at a dose rate of $1\times10^{13}$–$5\times10^{13}$ cm$^{-2}$ and with an acceleration energy 10–30 keV.

As shown in FIG. 11C, second side wall spacers 18b are then formed on the gate electrode side walls by forming an insulating film on the gate electrode 4 and the source/drain region and anisotropically etching the film. Then, a source/drain high impurity concentration N-type region 20 is formed at a dose rate of $1\times10^{15}$–$5\times10^{15}$ cm$^{-2}$ and an acceleration energy of 30–50 keV by using the gate 4 and the side wall spacers 18b as masks.

In this third embodiment, the pocket is formed before the side wall spacer formation. It is thus easy to control concentrations and regions irrespective of the N-type high and low impurity concentration regions 20 and 19 and is possible to controllability of the pocket 17. Again this third embodiment has an LDD type transistor structure with the pocket 17 formed on the drain side only, the pocket 17 suppressing the short channel effect while the current capacity is not reduced because no pocket is present on the source side.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor device comprising:

an LDD structure type MOS transistor including a gate electrode formed on a semiconductor layer of a first conductivity type;

a source/drain region formed in said semiconductor layer and having a high impurity concentration region and a low impurity concentration region of a second conductivity type; and a low impurity concentration region pocket of said first conductivity type formed only on a drain region side, said pocket being effective to suppress short channel effect as well as hot carrier generation, without reducing current capacity.

2. A semiconductor device according to claim 1, wherein said pocket is disposed immediately under said low impurity concentration region of the second conductivity type.

3. A semiconductor device according to claim 1, in which said pocket extends at least partly into a region between said low impurity concentration region of the second conductivity type and a channel region.

4. A semiconductor device according to claim 2, in which said pocket extends at least partly into a region between said low impurity concentration region of the second conductivity type and a channel region.

\* \* \* \* \*